(12) United States Patent
Oh

(10) Patent No.: US 10,620,039 B2
(45) Date of Patent: Apr. 14, 2020

(54) PHOTOELECTRIC SWITCH AND SENSOR UNIT

(71) Applicant: Keyence Corporation, Osaka (JP)

(72) Inventor: Choryon Oh, Osaka (JP)

(73) Assignee: Keyence Corporation, Osaka (JP)

(*) Notice: Subject to any disclaimer, the term of this patent is extended or adjusted under 35 U.S.C. 154(b) by 63 days.

(21) Appl. No.: 16/100,243

(22) Filed: Aug. 10, 2018

(65) Prior Publication Data

US 2019/0094067 A1 Mar. 28, 2019

(30) Foreign Application Priority Data

Sep. 27, 2017 (JP) ................................. 2017-186811

(51) Int. Cl.
| | |
|---|---|
| *G01J 1/02* | (2006.01) |
| *G01J 1/04* | (2006.01) |
| *H03K 17/94* | (2006.01) |
| *H02B 1/052* | (2006.01) |
| *H01L 27/32* | (2006.01) |
| *G01V 8/16* | (2006.01) |

(52) U.S. Cl.
CPC .......... *G01J 1/0271* (2013.01); *G01J 1/0425* (2013.01); *G01V 8/16* (2013.01); *H01L 27/3244* (2013.01); *H02B 1/052* (2013.01); *H03K 17/941* (2013.01); *H03K 2217/9401* (2013.01); *H03K 2217/94026* (2013.01); *H03K 2217/94108* (2013.01)

(58) Field of Classification Search
CPC .... G01J 1/0271; G01J 1/0425; H03K 17/941; H03K 2217/9401; H03K 2217/94026; H03K 2217/94108; H03K 17/78; H02B 1/052; H01L 27/3244; G01V 8/16; H05K 5/0017

USPC ............................................ 250/227.11, 239
See application file for complete search history.

(56) References Cited

U.S. PATENT DOCUMENTS 5,365,061 A * 11/1994 Enrique Munoz Elizondo ..........
................................................ G01J 1/04
................................................ 250/237 R
9,816,855 B2 * 11/2017 Hollingsworth ...... G01J 1/0219
(Continued)

FOREIGN PATENT DOCUMENTS

JP 2003-141961 A 5/2003

OTHER PUBLICATIONS

U.S. Appl. No. 16/100,244, filed Aug. 10, 2018 (61 pages).
(Continued)

*Primary Examiner* — Seung C Sohn
(74) *Attorney, Agent, or Firm* — Kilyk & Bowersox, P.L.L.C.

(57) ABSTRACT

To provide a connecting structure for a signal cable capable of securing a sufficient display area concerning a display in a photoelectric switch. A photoelectric switch includes a housing having a substantially rectangular parallelepiped shape. A display 5 is provided on a first surface of the housing and includes a display region. A signal cable 51 connects a control board and the display 5. The display 5 includes a connecting section 70a connected to the signal cable 51. The connecting section 70a is disposed between the display region and the signal cable in the longitudinal direction of the housing. Consequently, a connecting structure for the signal cable 5 capable of securing a sufficient display area concerning the display 5 in the photoelectric switch is provided.

17 Claims, 13 Drawing Sheets

(56) References Cited

U.S. PATENT DOCUMENTS 9,841,808 B2   12/2017  Hanada
2018/0059772 A1   3/2018  Hanada

OTHER PUBLICATIONS

U.S. Appl. No. 16/100,247, filed Aug. 10, 2018 (90 pages).
U.S. Appl. No. 16/100,248, filed Aug. 10, 2018 (75 pages).
U.S. Appl. No. 15/928,518, filed Mar. 22, 2018 (97 pages).
U.S. Appl. No. 15/928,499, filed Mar. 22, 2018 (59 pages).

* cited by examiner

PHOTOELECTRIC SWITCH AND SENSOR UNIT

CROSS-REFERENCE TO RELATED APPLICATIONS

The present application claims foreign priority based on Japanese Patent Application No. 2017-186811, filed Sep. 27, 2017, the contents of which is incorporated herein by reference.

BACKGROUND OF THE INVENTION

1. Field of the Invention

The present invention relates to a photoelectric switch and a sensor unit.

2. Description of Related Art

A product (work) produced in a factory is conveyed by a conveying apparatus such as a belt conveyor. Arrival of the work at a predetermined place is detected by a photoelectric switch. In general, the photoelectric switch projects light toward the work or the like, receives reflected light from the work, and displays a numerical value indicating a light receiving amount and a threshold compared with the numerical value on a seven-segment display (JP-A-2003-141961). When detecting the work on the basis of the light receiving amount and the threshold, the photoelectric switch outputs an ON signal that indicates that the work is detected.

In this way, the photoelectric switch is a relatively simple sensor that outputs a detection signal indicating whether the work is detected. Therefore, the seven-segment display has been adopted as a display for many years. A photoelectric switch not including a display that displays numerical values is still present.

However, in recent years, according to the upgrading of photoelectric switches, the seven-segment display has been unable to provide sufficient information to users. Therefore, the inventor of this application examined adoption of a dot matrix display such as an OLED (organic light emitting diode). The dot matrix display includes a large number of wires (a gate line, a signal line, a power supply line, and a ground line). The dot matrix display turns on and off semiconductor switches disposed in intersections of the wires to display information. The large number of wires are connected to a controller via a FPC cable. A problem is a housing shape of the photoelectric switch. In a factory, because a large number of photoelectric switches are coupled and attached to a DIN (Deutsches Institut für Normung) rail, the shape of the photoelectric switch is an elongated substantially rectangular parallelepiped shape. Therefore, the upper surface of the photoelectric switch to which the display is attached is also elongated. This limits the length in the latitudinal direction of the display. As explained above, the dot matrix display includes the large number of wires. Therefore, unless connecting positions of the wires and the FPC (flexible printed circuit board) cable are well thought out, it is difficult to secure a sufficient display area.

SUMMARY OF THE INVENTION

Therefore, an object of the present invention is to provide a connecting structure for a signal cable capable of securing a sufficient display area concerning a display in a photoelectric switch.

The present invention provides, for example, a photoelectric switch including: a housing having a substantially rectangular parallelepiped shape; a display unit provided on a first surface of the housing and including a display region; a light projecting unit and a light receiving unit provided on a second surface located adjacent to the first surface; a receiving unit provided on the first surface and configured to receive operation; a display control unit configured to cause the display unit to display, in the display region of the display unit, a threshold adjusted through the receiving unit and a signal value indicating an amount of light received by the light receiving unit; a first substrate housed on an inside of the housing, the display control unit being connected to the first substrate; and a signal cable for connecting the first substrate and the display unit. The display unit includes a connecting section connected to the signal cable. The connecting section of the display unit is disposed between the display region and the signal cable in a longitudinal direction of the housing.

According to the present invention, there is provided a connecting structure for a signal cable capable of securing a sufficient display area concerning a display in a photoelectric switch.

BRIEF DESCRIPTION OF THE DRAWINGS

FIGS. 6A to 6D are diagrams for explaining an upper case and the like;

DESCRIPTION OF EMBODIMENTS

An embodiment of the present invention is explained below. The individual embodiment explained below would be useful for understanding various concepts such as a superordinate concept, an intermediate concept, and a subordinate concept of the present invention. The technical scope of the present invention is decided by the claims and is not limited by the individual embodiment explained below.

Figure 1:
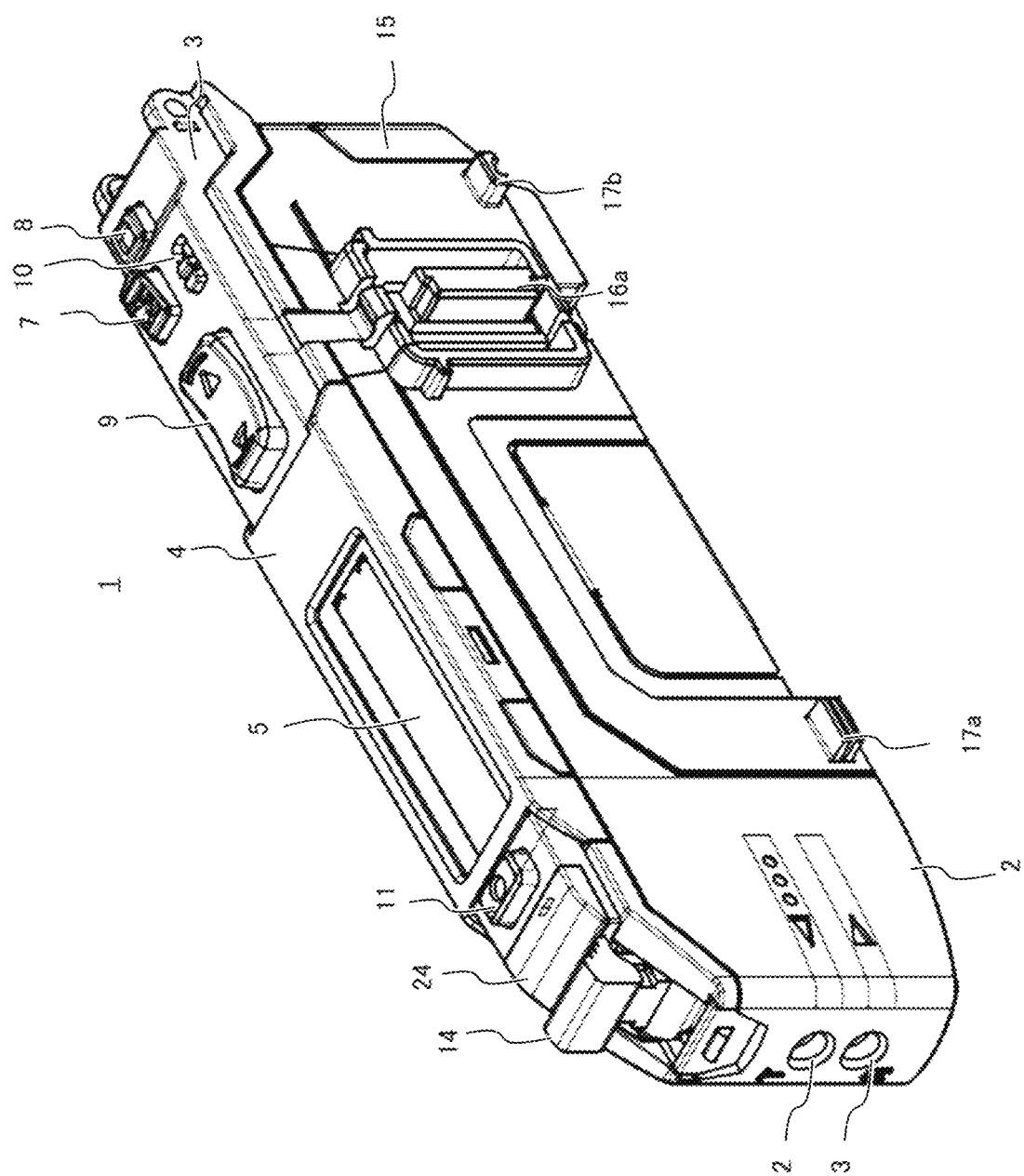
FIG. 1 is a perspective view showing a photoelectric switch.
Figure 1:
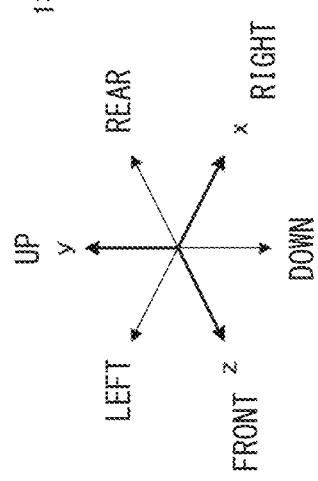

FIG. 1 is a perspective view showing a photoelectric switch. A photoelectric switch 1 includes a substantially rectangular housing. In FIG. 1, a z axis corresponds to a longitudinal direction, an x axis corresponds to a latitudinal direction, and a y axis corresponds to a height direction. The housing generally has six outer surfaces. The six outer surfaces include an upper surface, a bottom surface, a front surface, a rear surface, a left side surface, and a right side surface. In FIG. 1, the upper surface, the front surface, and the right side surface are seen. The housing includes a lower case 2 and an upper case 3. An internal space in which a control board and the like are housed is formed by fitting the lower case 2 and the upper case 3 with each other. A part of the upper case 3 forms the upper surface. A display 5, a mode button 7, an active receiver button 8, an adjustment button 9, a slide switch 10, a set button 11, a display lamp 24, a clamp module 14, and the like are provided on the upper surface. The display 5 is a dot matrix display such as an OLED and displays a threshold and a light receiving amount. The display 5 is held and fixed by the outer surface of the upper case 3 and a cover member 4. The display 5 is provided to be offset further to the front surface side than the center of the upper surface. The adjustment button 9 is a button for increasing and reducing a threshold and operating a menu. The menu is a menu displayed on the display 5 and including various setting items for setting the operation of the photoelectric switch 1. The mode button 7 is a button for switching an operation mode related to a light projection amount and the like. The active receiver button 8 is a special button for projecting light from the photoelectric switch 1 to the outside through a light receiving fiber. When detecting depression of the active receiver button 8, the photoelectric switch 1 uses the light receiving fiber as a light projecting fiber and projects light toward the outside while receiving light made incident from the outside. The projected light is not light for detecting work and is light for assisting optical axis adjustment by a user. Note that a light emitting element configured to output the assist light may be disposed in the center of a light receiving element. In this case, a light receiving surface of the light receiving element is larger than a light emitting surface of the light emitting element. The slide switch 10 is a switch for selecting a set of a plurality of setting parameters. The set button 11 is a button for starting automatic setting of a threshold. When detecting that the set button 11 is pressed, the photoelectric switch 1 determines a threshold according to a light receiving amount. For example, when the work is detected, the display lamp 24 is lit or extinguished. The clamp module 14 is a module configured to clamp and hold the light projecting fiber and the light receiving fiber. A tubular hole 12 into which the light projecting fiber is inserted and a tubular hole 13 into which the light receiving fiber is inserted are provided on the front surface of the housing. An output cable is attached to the rear surface of the housing. A cable bush 15 is a bush for holding the output cable.

Figure 2A:
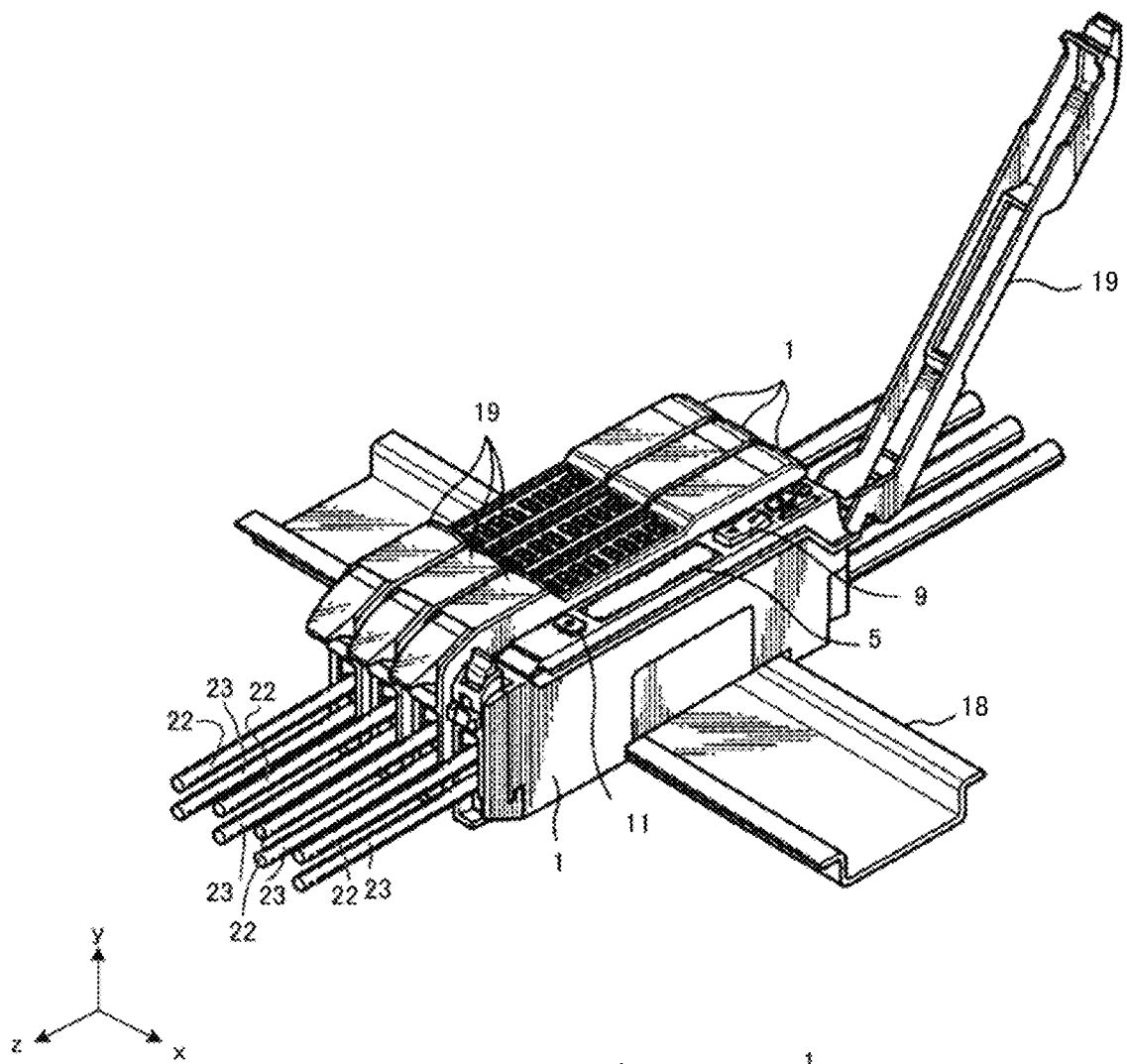
FIGS. 2A and 2B are perspectives view showing a plurality of photoelectric switches coupled to one another.
Figure 2B:
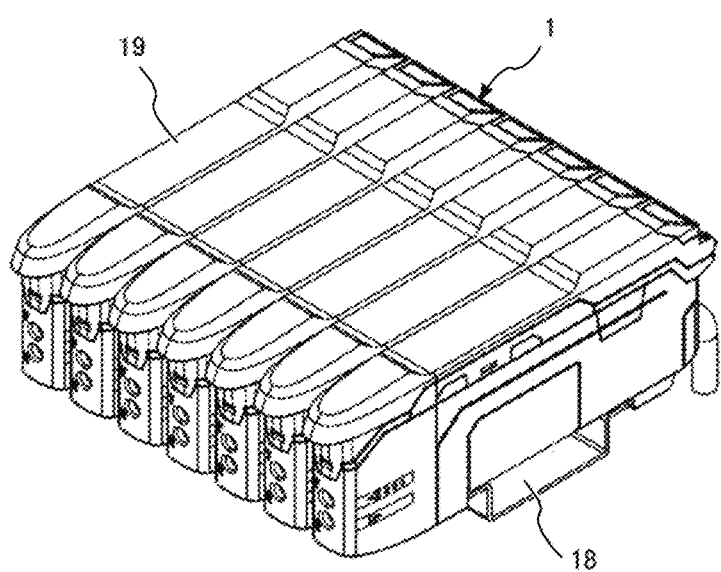

A connector 16a and coupling sections 17a and 17b are provided on the right side surface of the housing. FIG. 2A shows that a plurality of photoelectric switches 1 are respectively coupled to one another by the connectors 16a and the coupling sections 17a and 17b and fixed to a DIN rail 18. DIN is an abbreviation of Deutsches Institut für Normung. An incident end of a light projecting fiber 22 is inserted into the hole 12. An emission end of a light receiving fiber 23 is inserted into the hole 13. In FIG. 2A, an open-closable upper cover 19 configured to cover the upper surface of the housing is also shown. Note that, as shown in FIG. 2B, when the upper cover 19 has light transmissivity, a hole may not be provided on the upper surface of the upper cover 19. This is because, if the upper cover 19 has light transmissivity, the user can confirm display content of the display 5 even in a closed state of the upper cover 19. When the upper cover 19 does not have light transmissivity, as shown in FIG. 2A, a hole or a window may be provided on the upper surface of the upper cover 19. The upper cover 19 functions as a dust cover. As shown in FIGS. 2A and 2B, the plurality of photoelectric switches 1 can be respectively laterally coupled. Therefore, the plurality of photoelectric switches 1 are called interconnected sensor as well.

Figure 3:
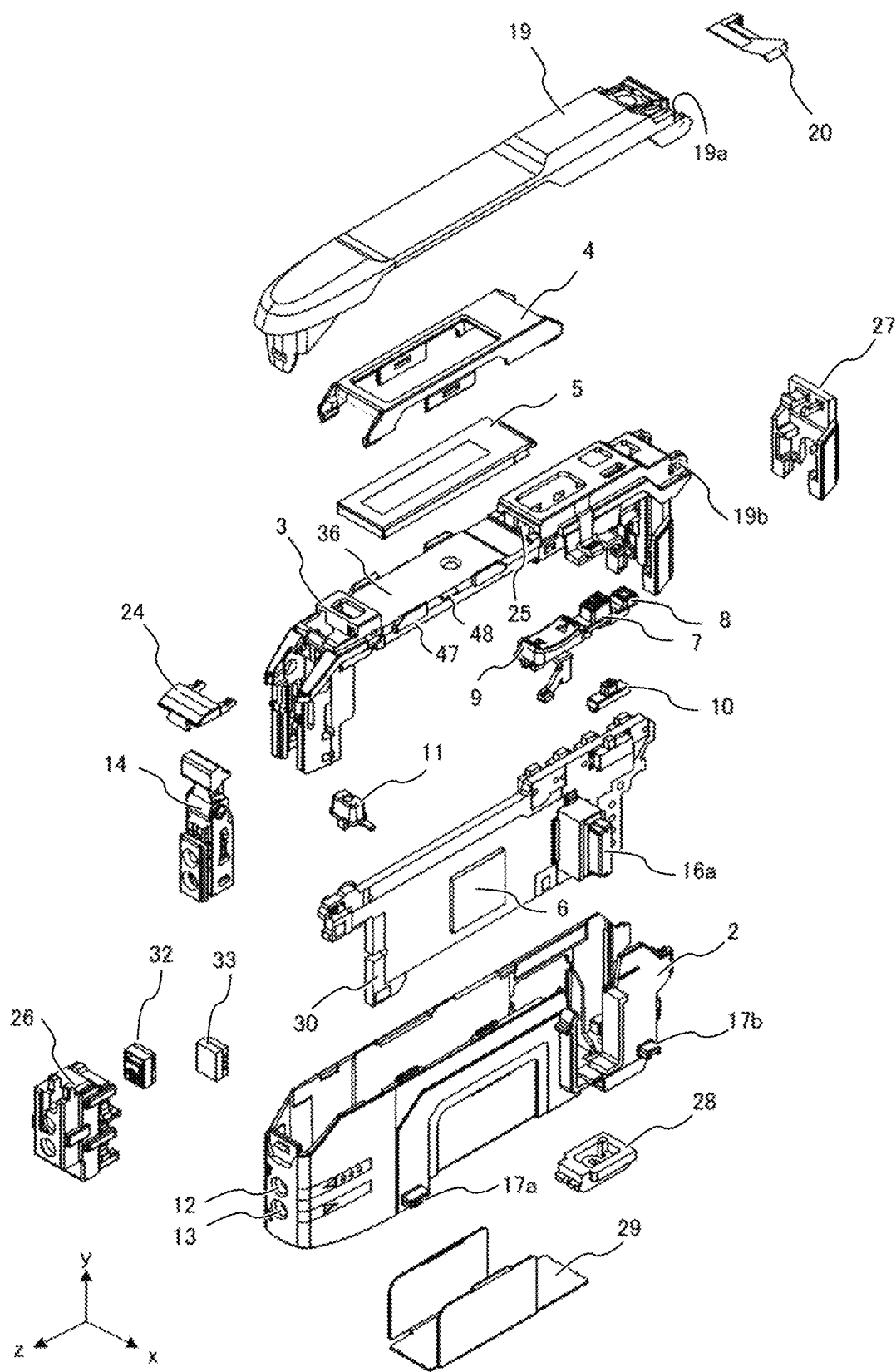
FIG. 3 are an exploded view showing the photoelectric switch.

FIG. 3 is an exploded view of the photoelectric switch 1. A decoration member 20 may be provided on the rear end side of the upper cover 19. A rotational pin 19a is provided on the rear end side of the upper cover 19. The rotational pin 19a fits in a holding hole 19b provided on the rear end side of the upper case 3. Consequently, the upper cover 19 is rotatably coupled to the upper case 3. To enable the user to confirm information displayed on the display 5 even in a closed state of the upper cover 19, the upper cover 19 may be formed by a transparent member. A backbone member 36 for supporting the display 5 is provided near the center of the upper case 3. Four fringes 47 are provided on the left and the right of the backbone member 36. The four fringes 47 are projecting sections projecting upward from the upper case 3. The four fringes 47 position the display 5 in the latitudinal direction (the x direction). Note that the four fringes 47 fit with recessed sections of the cover member 4. Two claw sections 48 are provided on the left and the right of the backbone member 36. The claw sections 48 fit with recessed sections provided on the inner side of a center leg of the cover member and fix the cover member 4 to the upper case 3. The recessed sections may be grooves or may be through-holes. An opening section 25 is provided on the rear end side of a display mounting section centering on the backbone member 36. The opening section 25 is a through-hole or a cutout for allowing a signal cable to pass from the outer surface to the inner surface side of the upper case 3. The signal cable includes a power supply line for supplying electric power to the display 5 and a control line for supplying a control signal to the display 5. The signal cable is connected to a control board 30. The control board 30 may be one substrate. If two substrates are provided in the x-axis direction, the length in the x-axis direction of the photoelectric switch 1 increases. Therefore, in this embodiment, only one control board 30 is provided in the x-axis direction. A controller 6 such as a CPU (central processing unit) is mounted on the control board 30. The controller 6 causes the display 5 to display a threshold and a light receiving amount. Switches corresponding to the adjustment button 9, the mode button 7, the active receiver button 8, the slide switch 10, and the set button 11 are mounted on the control board 30. The buttons may be formed of resin such as POM (polyacetal). Note that the upper cover 19, the cover member 4, and the housing may be basically formed of polycarbonate. An LED (light emitting diode) for supplying light to a light diffusing member of the display lamp 24 is also mounted on the control board 30. On the control board 30, the connector 16a for communicating with adjacent another photoelectric switch 1 and receiving electric power is provided. An element holder 26 is provided on the front surface side of the control board 30. A light emitting element 32 and a light receiving element 33 are attached to the element holder 26. The element holder 26 includes a hole for the light projecting fiber 22 inserted from the hole 12 and a hole for the light receiving fiber 23 inserted from the hole 13. The clamp module 14 is disposed on the front surface side of the element holder 26. The clamp module 14 holds the light projecting fiber 22 and the light receiving fiber 23. A fixture 28 for fixing to the DIN rail 18 and a metal cover 29 are attached to the bottom surface of the lower case 2. The metal cover 29 may play a role of heat radiation and an electromagnetic shield.

Figure 4A:
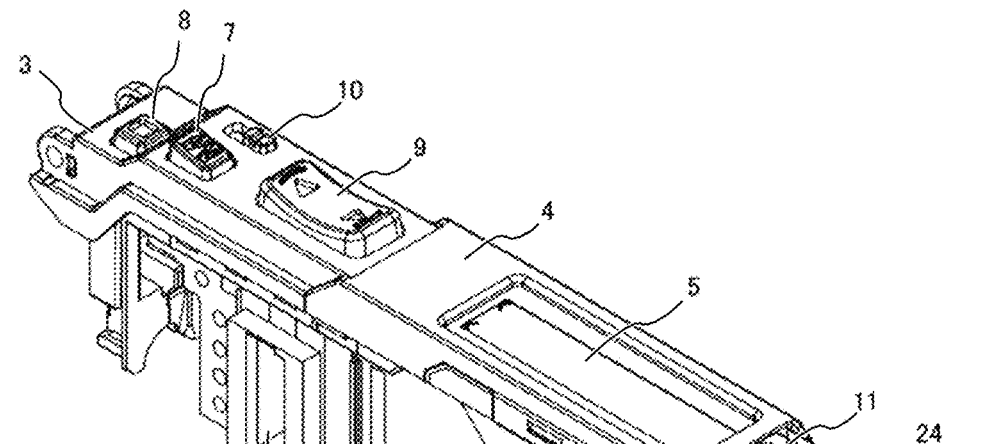
FIGS. 4A and 4B are perspective views showing the photoelectric switch.
Figure 4B:
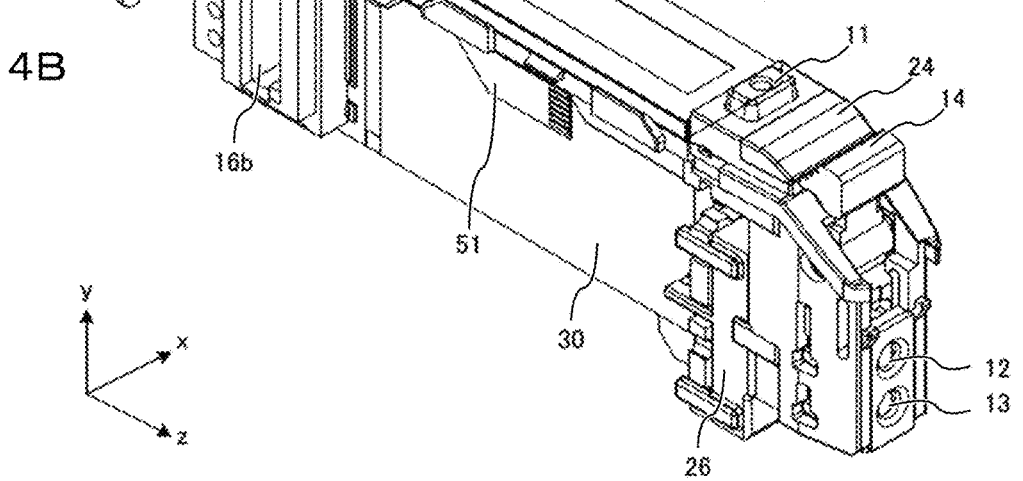

FIG. 4A is a perspective view of the photoelectric switch 1 in a state in which the cover member 4 is fixed to the upper case 3. FIG. 4B is a perspective view of the photoelectric switch 1 in a state in which the cover member 4 is not fixed to the upper case 3. Various buttons and the display 5 are fixed to the upper case 3. Further, the control board 30 is fixed to the upper case 3. A signal cable 51 electrically connected to the display 5 and the control board 30 enters the inside of the housing passing through the opening section 25. The signal cable 51 is connected to a connector of the control board 30. A connector 16b is provided on the left side surface of the control board 30. The connector 16b of the photoelectric switch 1 is a female connector. The connector 16b fits with and is electrically connected to the male connector 16a of another photoelectric switch 1 located on the left of the photoelectric switch 1.

Note that, as it is seen from FIG. 4A and the like, the height of the active receiver button 8 is smaller than the heights of the mode button 7 and the adjustment button 9. This is to prevent wrong operation of the active receiver button 8.

Figure 5:
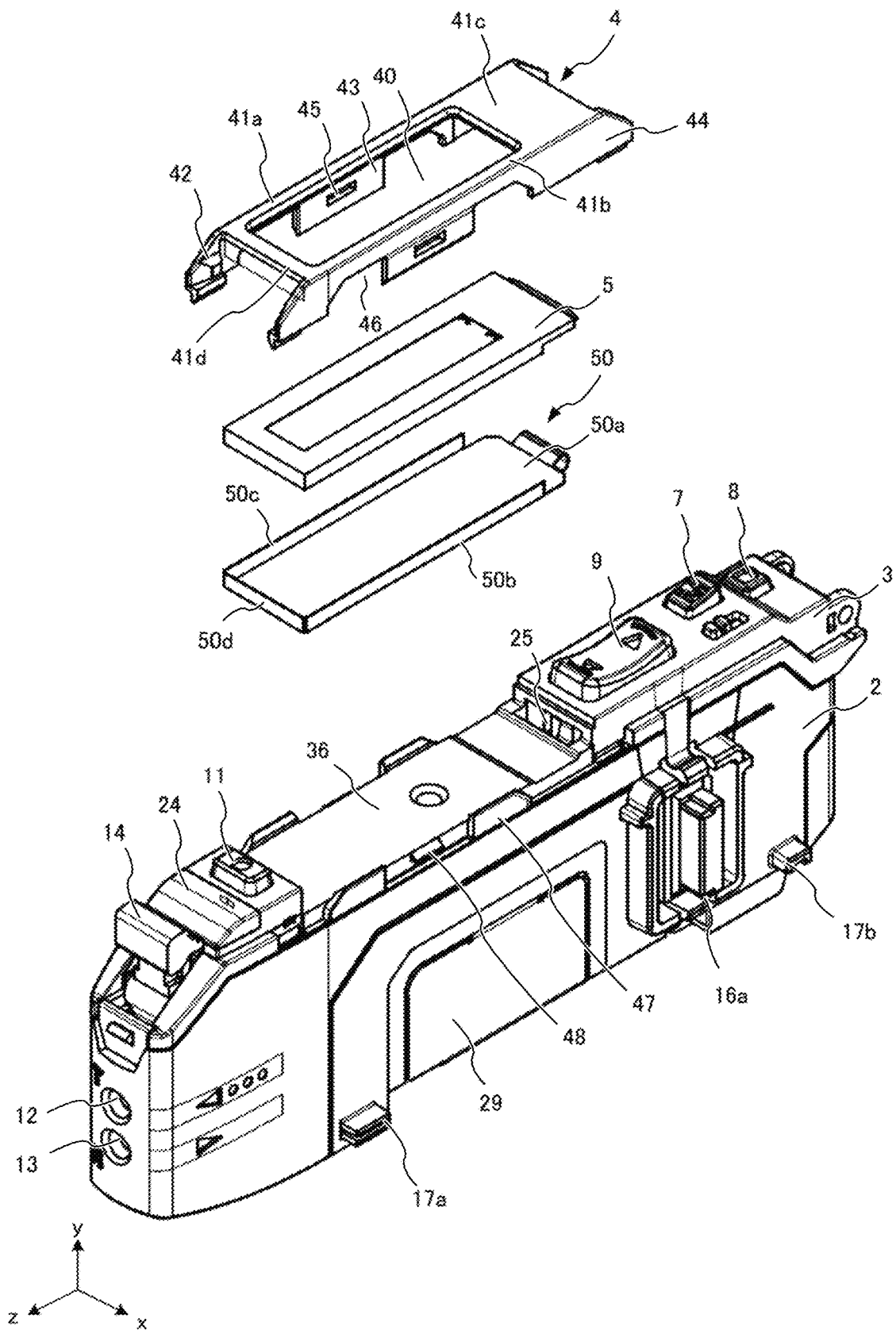
FIG. 5 is a perspective view showing a positional relation among a cover member, a display, and a shield member.

FIG. 5 is a perspective view for explaining the cover member 4 in detail. The cover member 4 includes two front legs 42, two center legs 43, and two rear legs 44. A window section 40 is provided on the upper surface of the cover member 4. The user can view a display surface of the display 5 through the window section 40. The window section 40 is surrounded by four frames. A left frame 41a and a right frame 41b are thin compared with a front frame 41d and a rear frame 41c. This is to secure a display area in the latitudinal direction of the photoelectric switch 1. The rear frame 41c has a large area compared with the other frames. This is to protect, with the rear frame 41c, for example, an IC configured to control the display 5. Character information and the like may be printed on the rear frame 41c. Because the rear frame 41c has a certain degree of an area, even if the user presses the adjustment button 9 with a finger, display information on the display 5 is less easily hidden by the finger. That is, the rear frame 41c can sufficiently separate the display 5 and the buttons from each other. Note that, because the area of the front frame 41d is small, the display lamp 24 and the display 5 can be set close to each other. Consequently, information transmitting mechanisms focused by the user can be integrated in one place. Four cutouts 46 in total are provided on the right side surface and the left side surface of the cover member 4. The four cutouts 46 fit with the four fringes 47 provided in the upper case 3, position the cover member 4 with respect to the upper case 3, and fixes the cover member 4 to the upper case 3. Recessed sections 45 are respectively provided on the inner surface sides of the two center legs 43. The recessed sections 45 fit with the claw sections 48 respectively provided on the right side surface and the left side surface of the upper case 3. A shield member 50 may be adopted to protect the front surface, the bottom surface, the left side surface, and the right side surface of the display 5. The shield member 50 includes a front wall 50d configured to protect the front surface of the display 5, a bottom section 50a configured to protect the bottom surface of the display 5, a right wall 50b configured to protect the right side surface of the display 5, and a left wall 50c configured to protect the left side surface of the display 5. The display 5 is held by the backbone member 36 and the cover member 4 in a state in which the display 5 is covered with the shield member 50. The shield member 50 is formed by an FPC (flexible printed circuit board).

Figure 6A:
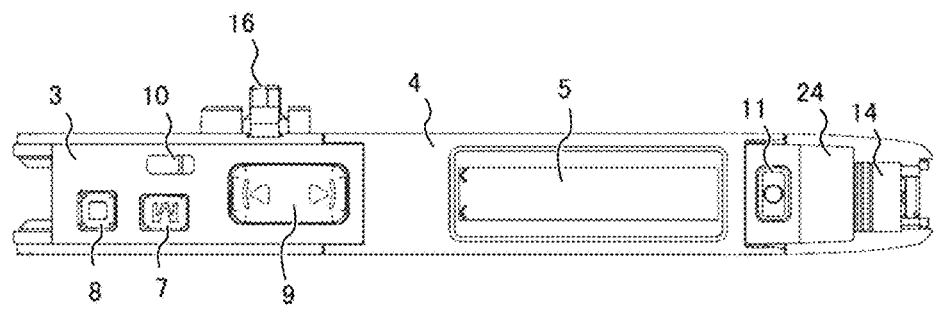

FIG. 6A is a plan view showing the upper surface of the photoelectric switch 1. As shown in FIG. 6A, a switch and a button are not provided in the latitudinal direction of the display 5. Therefore, a dimension in the latitudinal direction of the display 5 can be set sufficiently large. Note that the rear frame of the cover member 4 has an area enough for printing characters and the like.

Figure 6B:
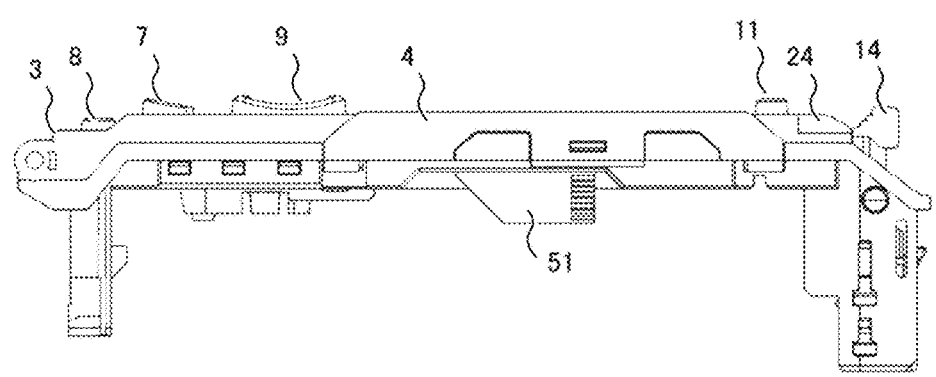
Figure 6C:
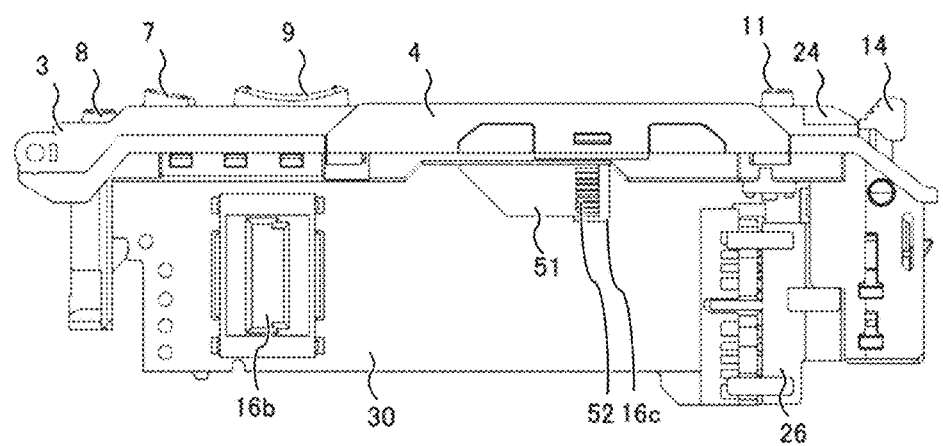

FIG. 6B shows the left side surface of the upper case 3. FIG. 6C shows the left side surface of the upper case 3 to which the control board 30 is attached. A terminal 52 of the signal cable 51 extending from the display 5 is connected and fixed to a connector 16c mounted on the control board 30. The signal cable 51 enters the inside from the outside of the housing and is connected to the control board 30. Therefore, the signal cable 51 is formed by a thin FPC cable or the like having flexibility.

Figure 6D:
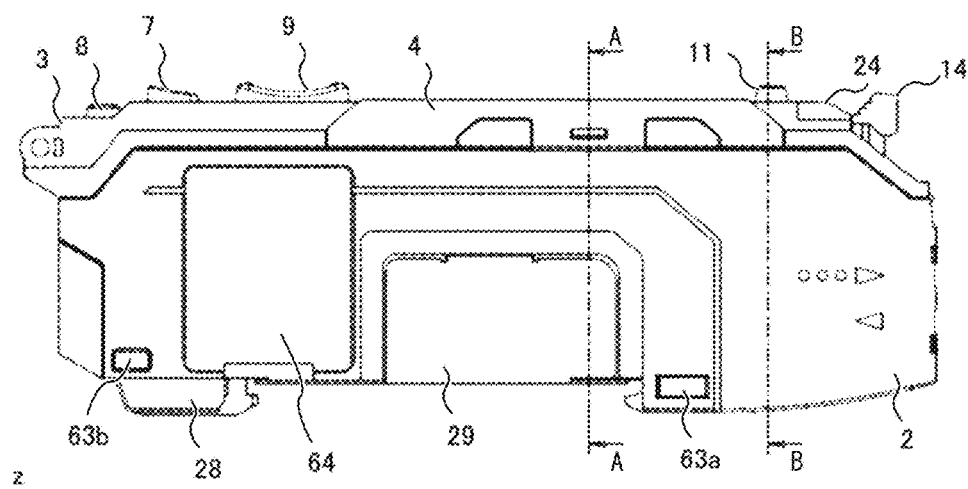

FIG. 6D shows the photoelectric switch 1 in a state in which the lower case 2 is attached to the photoelectric switch 1. Fixing holes 63a and 63b are provided on the left side surface of the lower case 2. The coupling sections 17a and 17b of another photoelectric switch 1 located on the left of the photoelectric switch 1 are respectively inserted into the fixing holes 63a and 63b of the photoelectric switch 1. Note that a hole from which the connector 16b is exposed is provided on the left side surface of the lower case 2. In FIG. 6D, a lid 64 protects the hole.

Disposition of the Signal Cable with Respect to the Display

Figure 7A:
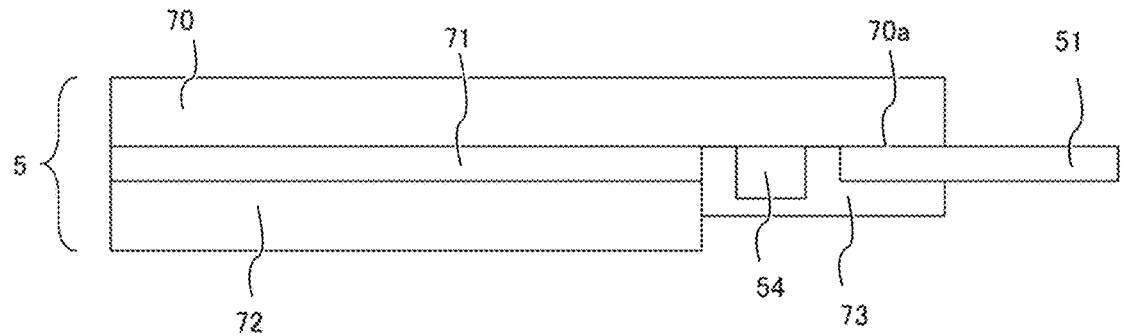
FIGS. 7A to 7C are diagrams for explaining a relation between the display and a signal cable.

FIG. 7A shows the right side surface of the display 5. The display 5 is formed by stacking a transparent member 70, an OLED layer 71, and a transparent base material 72 in the height direction. A material of the transparent member 70 and the transparent base material 72 is a transparent substrate (a second substrate) including glass and resin. A transparent electrode extending from the long side of the OLED layer 71 and a transparent electrode extending from the short side of the OLED layer 71 are formed on the bottom surface of the transparent member 70 and are electrically connected to a driving IC 54. The driving IC 54 is an integrated circuit configured to drive the display 5. The driving IC 54 is fixed to the bottom surface of the transparent member 70 by adhesive 73. The signal cable 51 extending from the control board 30 is electrically connected to the terminal of the driving IC 54. In this way, the signal cable 51 is connected to an end portion in the longitudinal direction of the display 5, that is, a terminal (a connecting section 70a) provided on the side of the short side of the display 5. This makes it easy to secure a display area in the latitudinal direction of the display 5. In work manufacturing and inspection sites, a plurality of photoelectric switches 1 are coupled and used. Therefore, the length in the latitudinal direction of the photoelectric switch 1 is set to, for example, 5 mm or more or 14 mm or less. If the driving IC 54 and the signal cable 51 are attached to the latitudinal direction of the display 5, a display region of the display 5 is narrowed. That is, it is hard to read characters displayed on the display 5. Therefore, it is desirable that the driving IC 54 and the signal cable 51 are not attached to the end portion (the side of the long side) in the latitudinal direction of the display 5.

Figure 7B:
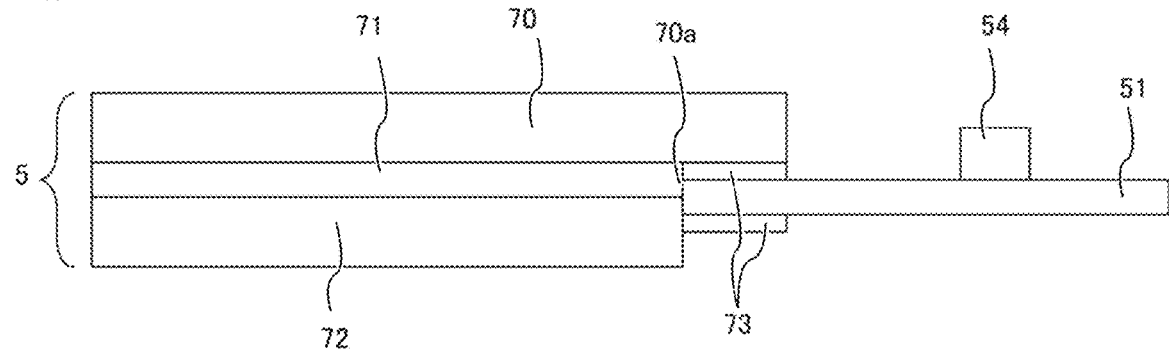

FIG. 7B shows that the driving IC 54 is provided halfway in the signal cable 51. This would be useful for reducing the length in the longitudinal direction of the transparent member 70. The transparent electrode extending from the long side of the OLED layer 71 is connected to the signal cable 51 as the terminal (the connecting section 70a) provided on the side of the short side of the display 5.

Figure 7C:
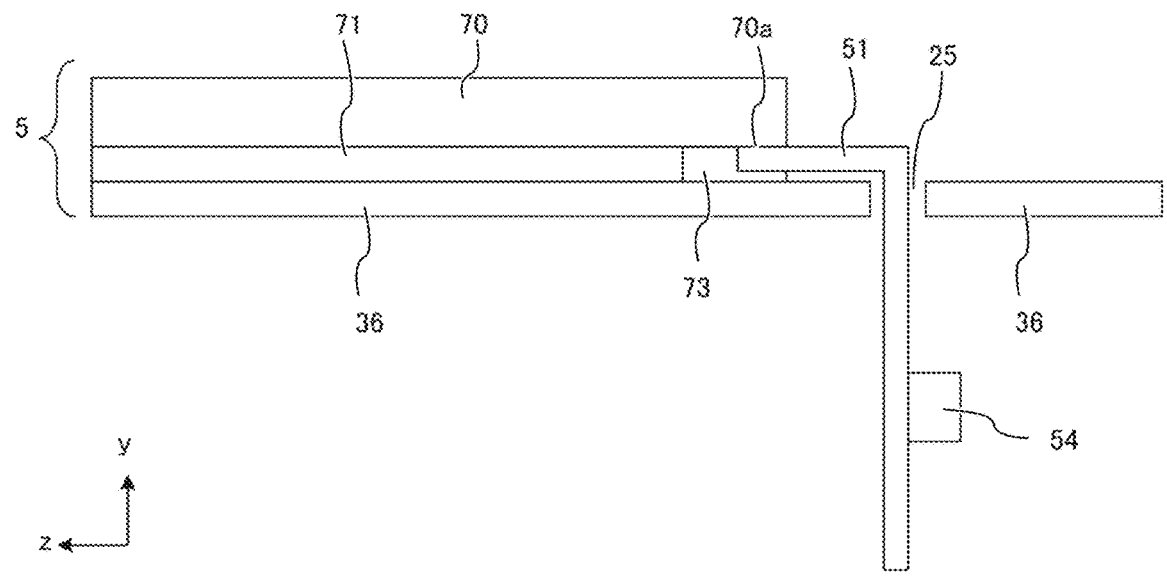

FIG. 7C shows that the backbone member 36 of the upper case 3 is adopted as a base material instead of the transparent base material 72. This is useful for reducing the display 5 in thickness. That is, this is useful for reducing the height of the display 5. The opening section 25 is provided in the backbone member 36. The signal cable 51 enters the inside of the housing passing through the opening 25. The driving IC 54 is disposed to be located halfway in the signal cable 51 and on the inside of the housing. Note that the transparent electrode extending from the long side of the OLED layer 71 and provided in the transparent member 70 is connected to the signal cable 51 as the terminal (the connecting section 70a) provided on the side of the short side of the display 5.

In this way, the display 5 includes the OLED layer 71 functioning as a display layer and the transparent member 70. The transparent electrode functions as a signal line extending from the OLED layer 71 toward the signal cable 51. The transparent electrode is provided in the vicinity of the interface between the OLED layer 71 and the transparent member 70. The cover member 4 covers a side surface in the vicinity of the interface between the OLED layer 71 and the transparent member 70. Because the vicinity of the interface is easily broken, the cover member 4 protects the vicinity of the interface.

Disposition of a Cable Passing Section

Figure 8A:
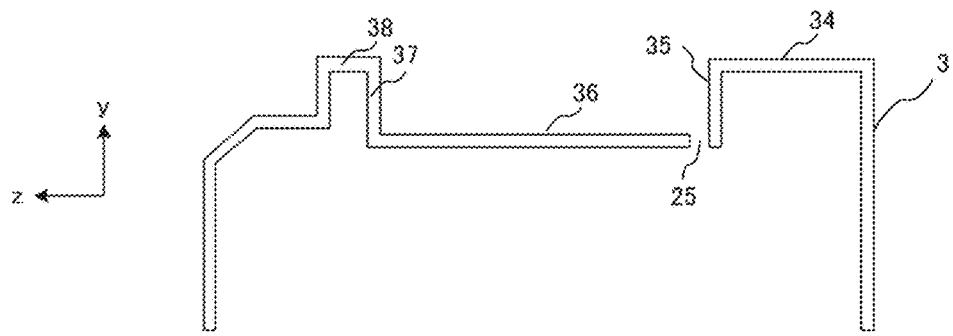
FIGS. 8A to 8E are diagrams for explaining a position of a slit.
Figure 8B:
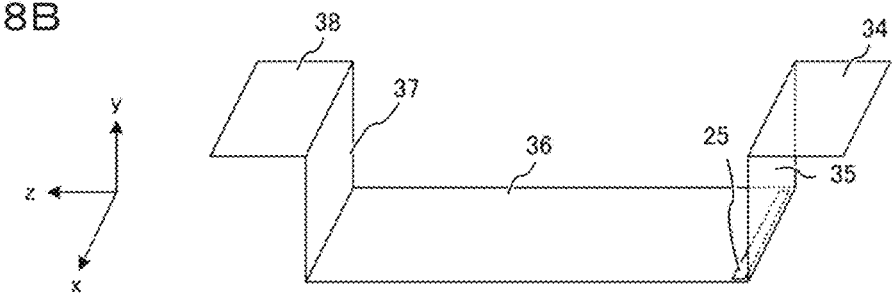
Figure 8C:
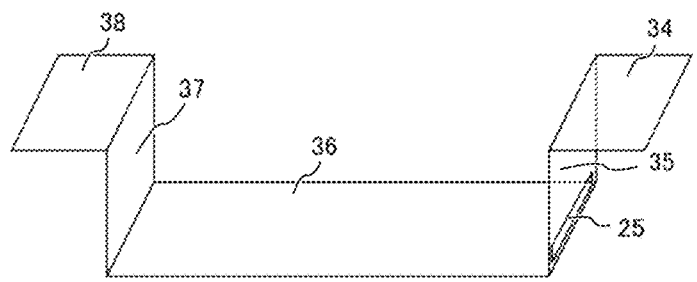
Figure 8D:
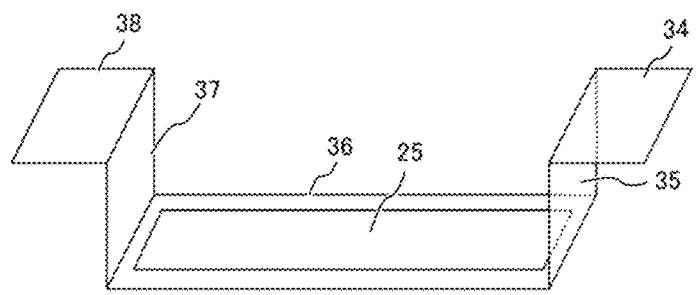
Figure 8E:
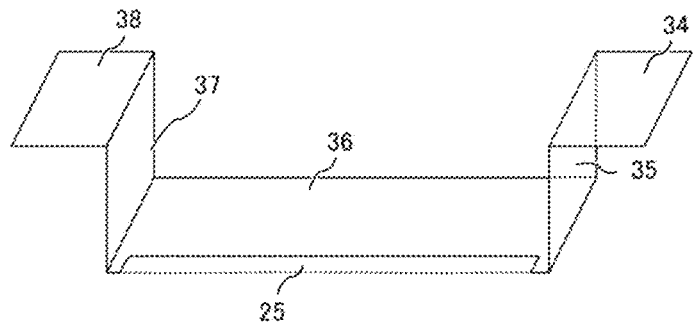

FIG. 8A is a schematic sectional view of the upper case 3. FIGS. 8B to 8E are perspective views of the display mounting section. The upper case 3 includes a first upper surface 38 on which the set button 11 is disposed, a second upper surface (a front wall 37), a third upper surface (the backbone member 36), a fourth upper surface (a rear wall 35), and a sixth upper surface 34 on which the adjustment button 9 and the like are disposed. Note that the first upper surface 38 and the sixth upper surface 34 may be called upper stage and the backbone member 36 may be called lower stage. In this way, the upper surface of the upper case 3 may have a level difference. The backbone member 36 may be called placing section. The placing section may be solid from the viewpoint of improving rigidity. As shown in FIG. 8A, the second upper surface (the front wall 37), the third upper surface (the backbone member 36), and the fourth upper surface (the rear wall 35) form a recessed section on a cross section extending along the longitudinal direction of the housing. The display 5 is pressed against the wall surface (the front wall 37) on a closer side to the second upper surface of the two wall surfaces forming the recessed section. According to FIGS. 8A and 8B, the opening section 25 is a slit-like hole provided on the rear end side of the backbone member 36. This indicates that the opening section 25 may be provided on the front end side of the backbone member 36. According to FIG. 8C, the opening section 25 is provided on the lower side of the rear wall 35. This indicates that the opening section 25 may be provided on the lower side of the front wall 37. The opening section 25 may be provided in a coupling section of the backbone member 36 and the rear wall 35 (the front wall 37). That is, a slit may be formed to extend across the backbone member 36 and the rear wall 35 (the front wall 37). FIG. 8D shows that the opening section 25 is provided in the center of the backbone member 36. The area of the opening section 25 is smaller than the base area of the display 5. This is to support the bottom surface of the display 5 with the backbone member 36. However, the bottom surface of the display 5 only has to be supported by either two long frames extending in the longitudinal direction of the backbone member 36 or two short frames extending in the latitudinal direction of the backbone member 36. FIG. 8E shows that the cutout-like opening section 25 is provided on the right side of the backbone member 36. This indicates that the cutout-like opening section 25 may be provided on the left side of the backbone member 36. If the signal cable 51 is a cable that has high flexibility and is bendable like an FPC cable, a degree of freedom of the disposition of the opening section 25 would increase. Note that, in the case shown in FIG. 8, the signal cable 51 would be mainly connected to the side of the long side of the display 5. However, if the signal cable 51 is the FPC cable, it would be also possible to allow the signal cable 51 to pass through the cutout-like opening section 25 shown in FIG. 8E by bending the signal cable 51 extending from the side of the short side of the display 5.

Figure 9A:
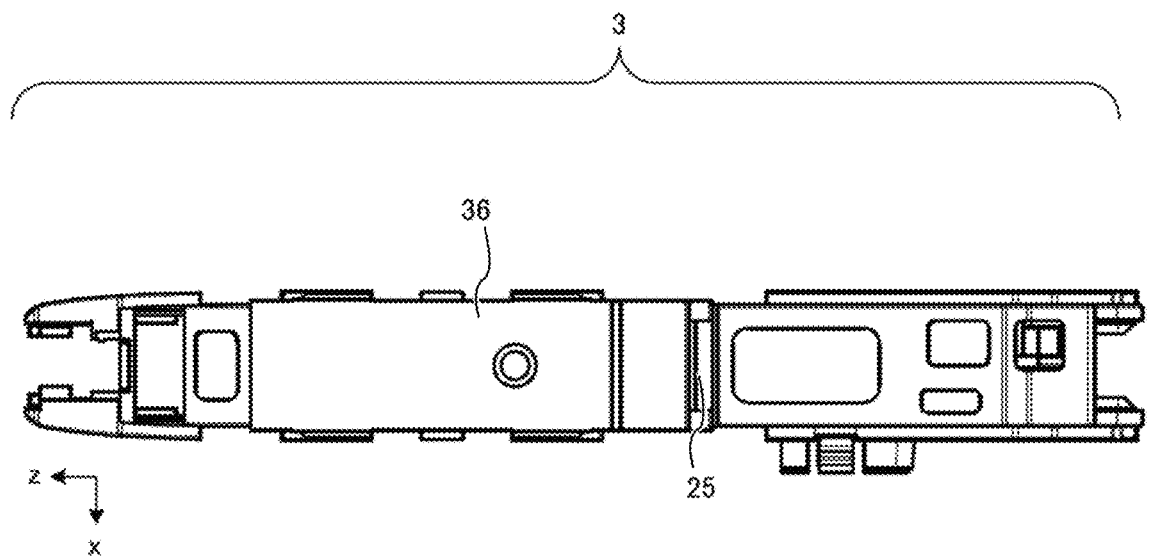
FIGS. 9A and 9B are diagrams for explaining the position of the slit.
Figure 9B:
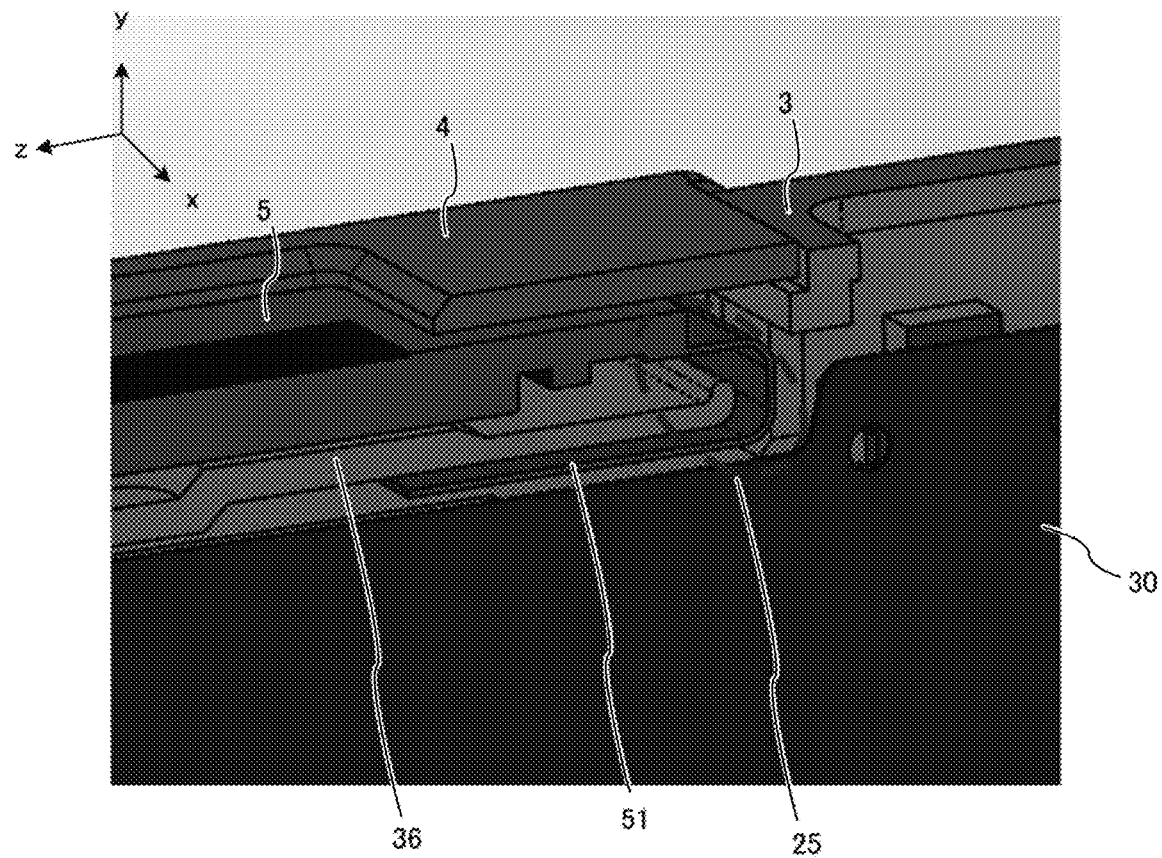

FIG. 9A shows the display section 25 provided at the rear end portion of the backbone member 36. As shown in FIG. 9A, the housing of the photoelectric switch 1 is elongated. When focusing on the backbone member 36, it is seen that the display mounting section is present to the edge of the housing. This is useful for expanding the display area of the display 5. The opening section 25 being provided on the rear end side of the backbone member 36 is also useful for expanding the display area of the display 5. FIG. 9B shows the signal cable 51 bent to pass through the opening section 25. In this way, the signal cable 51 extends from the outside to the inside of the upper case 3 via the opening section 25.

Integration of the Signal Cable with the Shield

Figure 10:
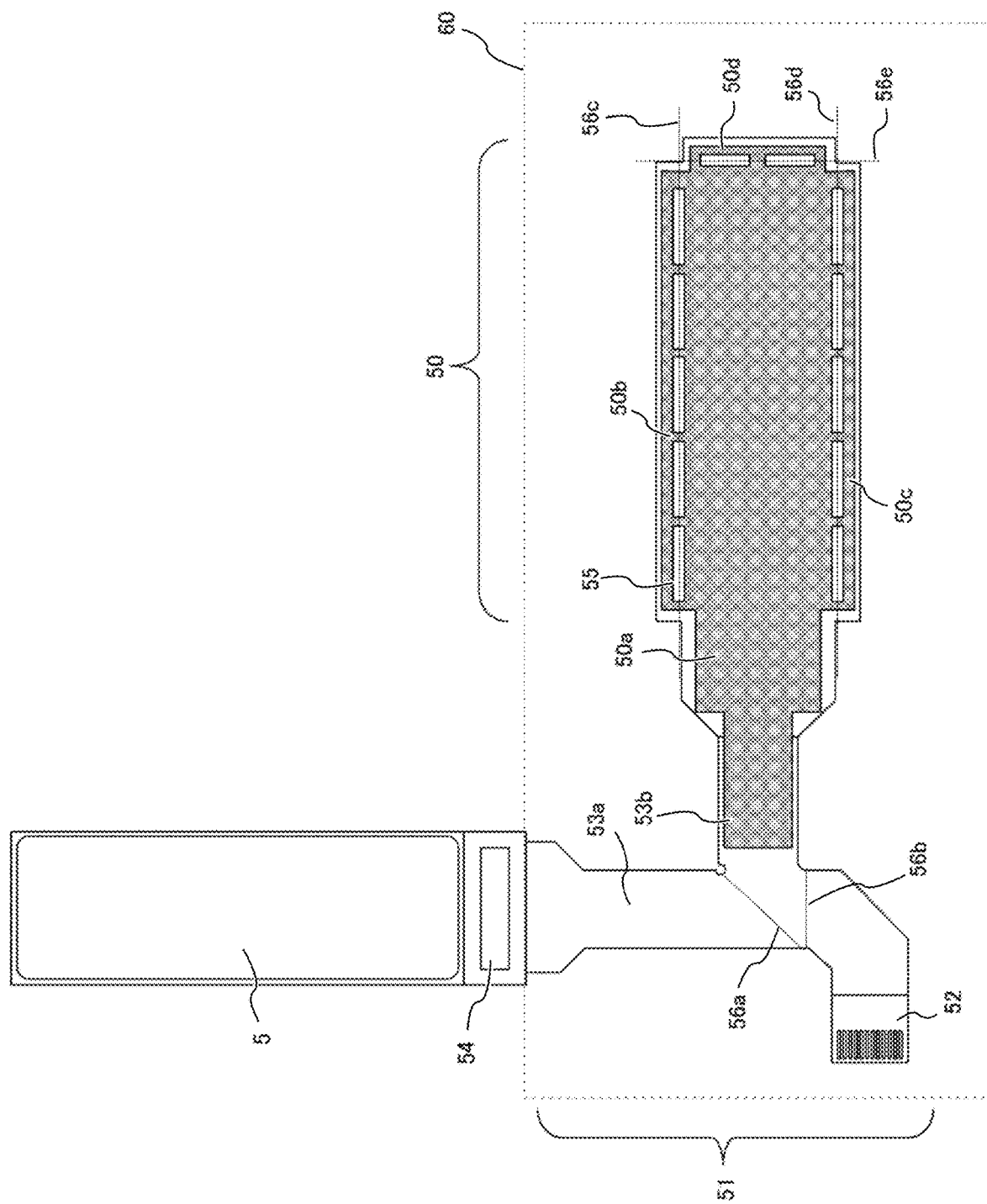
FIG. 10 is a diagram showing the signal cable and the shield member integrated with each other.

FIG. 10 shows the signal cable 51 configured by an FPC 60. A display module including the display 5 and the driving IC 54 is also shown together with the signal cable 51. Note that the signal cable 51 is integrated with the shield member 50 by the FPC 60. The shield member 50 includes a metal layer of copper or the like and a base film layer. The right wall 50b is formed by folding the FPC 60 at a right angle along a fold 56c. The left wall 50c is formed by folding the FPC 60 at a right angle along a fold 56d. The front wall 50d is formed by folding the FPC 60 at a right angle along a fold 56e. Note that, to make it easy to fold the FPC 60, a plurality of holes 55 may be provided in the metal layer along the folds 56c, 56d, and 56e. The metal layer is connected to a ground line of the signal cable 51. Consequently, the shield member 50 can protect the OLED (the display 5) from electric noise.

Further, when the FPC 60 is valley folded along a fold 56a, the shield member 50 covers the bottom surface of the display 5. A portion bent in a U shape in the signal cable 51 shown in FIG. 9B is formed by superimposing a signal wiring section 53a and a shield wiring section 53b in the FPC 60. That is, when the FPC 60 is valley folded along the fold 56a, the signal wiring section 53a and the shield wiring section 53b overlap. Further, when being inserted through the opening section 25, the overlapping portion of the signal wiring section 53a and the shield wiring section 53b is bent in a U shape. Further, when the FPC 60 is folded at a right angle along a fold 56b, a mounting surface of the terminal 52 becomes parallel to the control board 30.

Figure 11C:
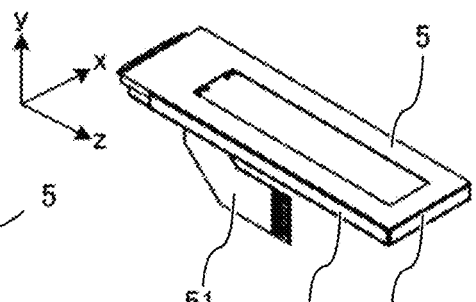
FIGS. 11A to 11E are diagrams for explaining a relation between the display and the signal cable.
Figure 11A:
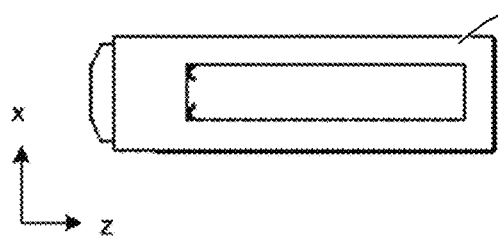
Figure 11B:
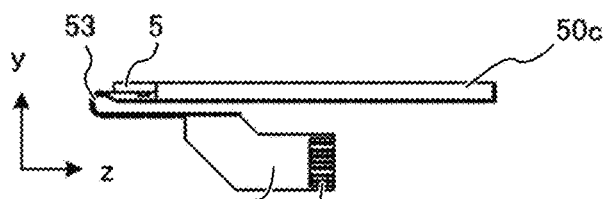
Figure 11D:
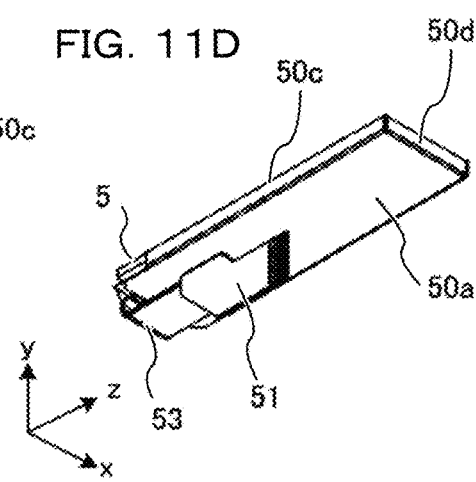
Figure 11E:
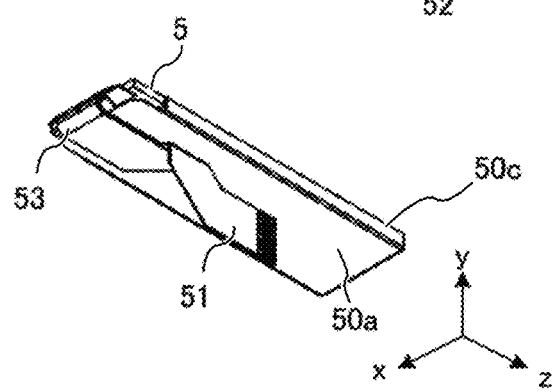

FIGS. 11A to 11E show a positional relation between the display 5 and the signal cable 51. FIG. 11A is a plan view of the display 5 to which the signal cable 51 is connected. FIG. 11B is a diagram showing the left side surface of the display 5. The signal cable 51 extending from the rear end side of the display 5 is bent in a U shape in a superimposed section 53 formed by superimposing the signal wiring section 53a and the shield wiring section 53b. Further, when the signal cable 51 is bent at a right angle along the fold 56b, the mounting surface of the terminal 52 becomes parallel to the control board 30. FIGS. 11C to 11E are perspective views of the display 5. The mounting surface of the terminal 52 is parallel to the control board 30 but is orthogonal to the bottom surface of the display 5.

The terminal 52 may be configured from, for example, eight pins. A VCC pin is a pin for supplying electric power to the driving IC 54. A VSS pin is a pin connected to the ground (for providing ground potential). An RES pin is a pin for supplying a reset signal for starting and restarting the driving IC 54 to the driving IC 54. An SCLK pin is a pin for supplying a clock for serial communication. An SDA pin is a pin for transmitting data for serial communication. An IREF pin is a pin for adjusting an electric current fed to the OLED layer 71. A VCOMH pin is a pin for connecting an external capacitor and the driving IC 54 to stabilize an internal power supply of the driving IC 54. A VDD pin is a pin for supplying a voltage for logic operation of the driving IC 54.

Note that the shield member 50 may be a shield seat configured by a member separate from the signal cable 51.

Shield

Figure 12A:
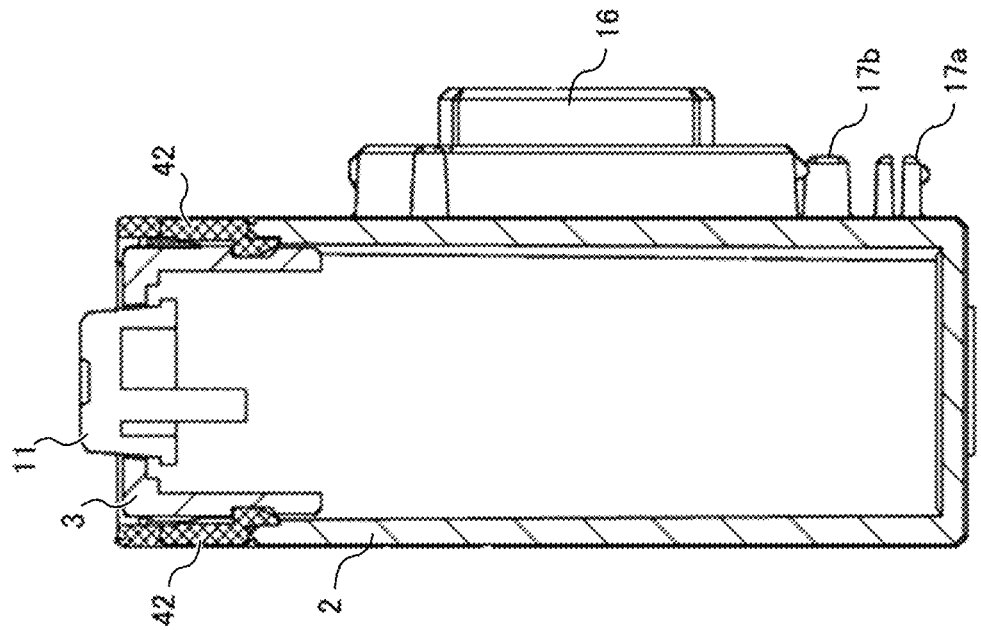
FIGS. 12A and 12B are sectional views of the photoelectric switch.
Figure 12B:
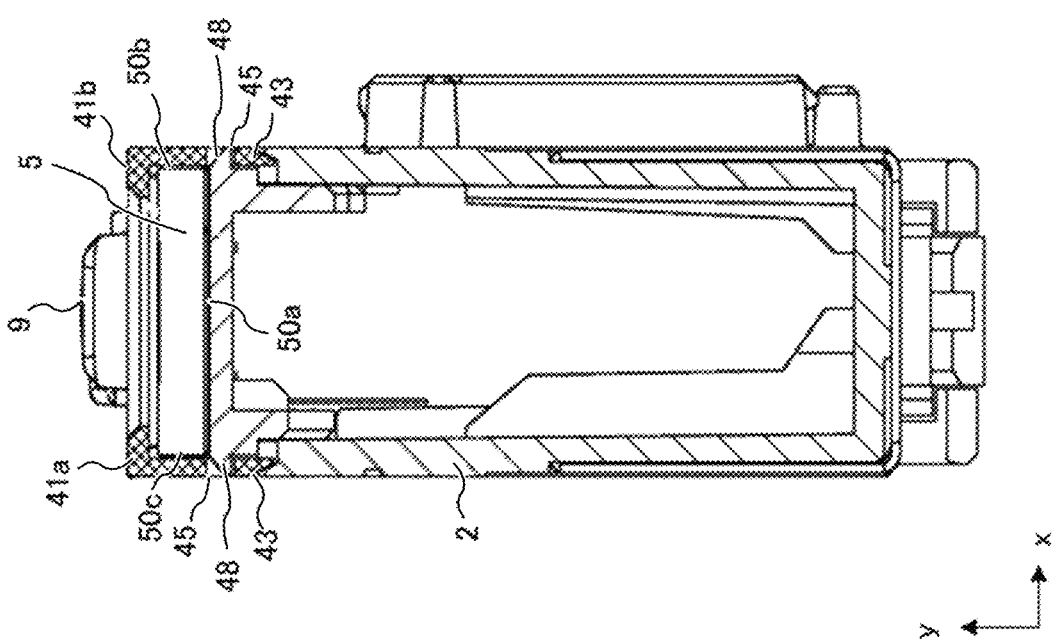
Figure 13:
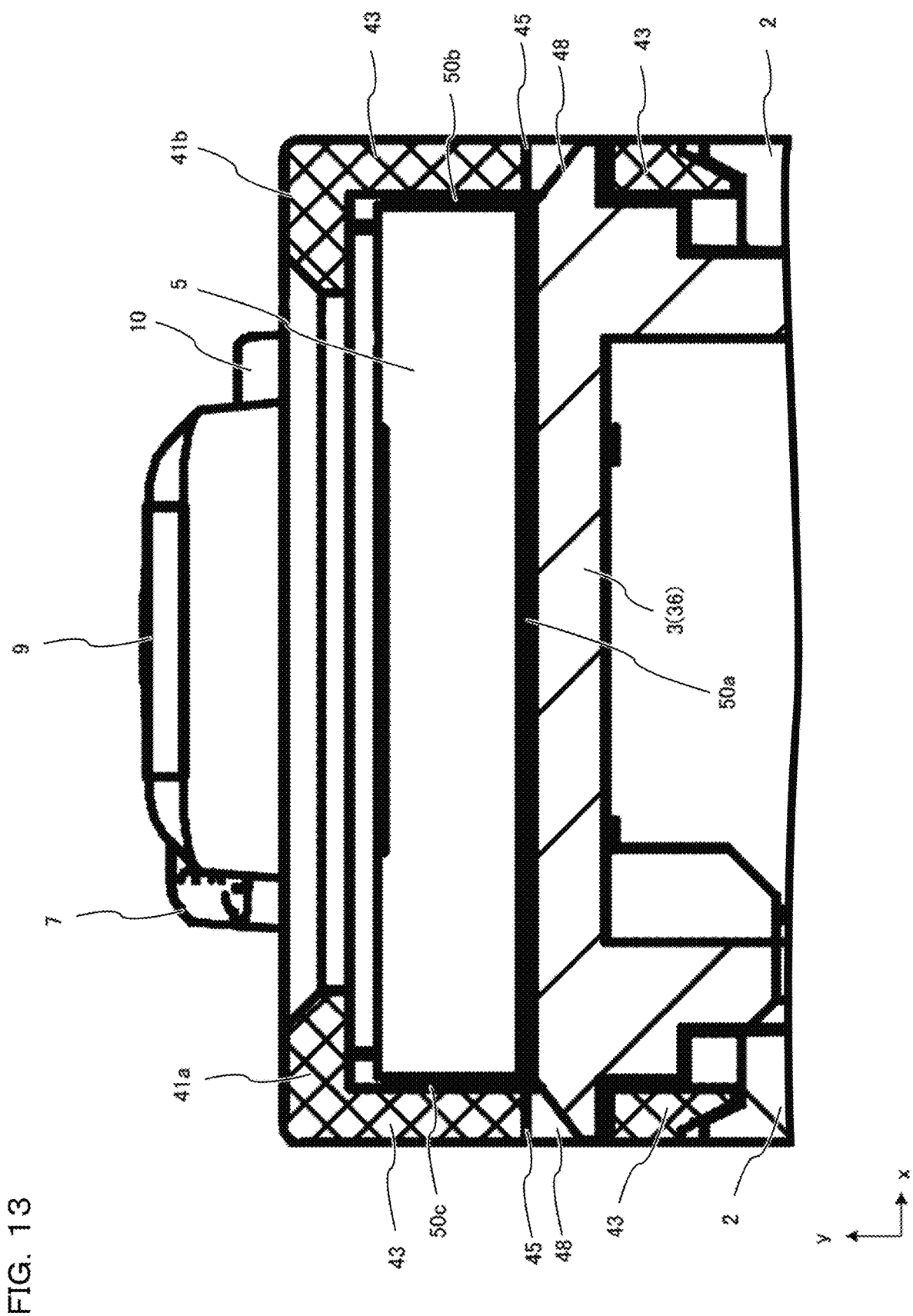
FIG. 13 is an enlarged view of a cross section of the photoelectric switch.

FIG. 12A is an A-A sectional view obtained by cutting the photoelectric switch 1 along an A-A cut line in FIG. 6D. FIG. 12B is a B-B sectional view obtained by cutting the photoelectric switch 1 along a B-B cut line in FIG. 6D. FIG. 13 is an enlarged view enlarging and showing a part of FIG. 12A. As shown in FIGS. 12A and 13, claw sections 48 of the upper case 3 are fit in the recessed sections 45 provided in the left and right center legs 43 of the cover member 4. As shown in FIGS. 12A, 12B, and 13, the height of the right wall 50b and the height of the left wall 50c of the shield member 50 are respectively heights for covering the OLED layer 71 and the transparent base material 72 of the display 5 and covering at least a part of the transparent member 70. The transparent member 70 and the transparent base material 72 are glass or the like. The glass is easily broken compared with resin. Therefore, the shield member 50 protects the transparent member 70 and the transparent base material 72 from a shock and the like. The OLED layer 71 is further protected from electric noise as well by the shield member 50. The bottom surface of the display 5 is covered by the bottom section 50a of the shield member 50. The backbone member 36 prevents heat generated from the control board 30 from being easily transmitted to the display 5.

As shown in FIG. 12B, the distal end portions of the left and right front legs 42 of the cover member 4 are held by the lower case 2 and the upper case 3. Consequently, the cover member 4 is firmly fixed to the housing.

Summary

As explained with reference to FIG. 1 and the like, the photoelectric switch 1 includes the housing having the substantially rectangular parallelepiped shape. That is, the housing is elongated. The display 5 is an example of a display unit attached to the outer surface, that is, a first surface of the housing. In the past, because a display is housed inside a housing of a photoelectric switch, the distance from the outer surface of the housing to the display is long and display information is less easily seen. In this embodiment, because the display 5 is attached to the outer surface of the housing, the distance from the outer edge of the photoelectric switch 1 to the display 5 is short and display information of the display 5 is easily seen. The light emitting element 32, the hole 12, and the like are an example of a light projecting unit provided near a second surface located adjacent to the first surface. The light receiving element 33 and the hole 13 are an example of a light receiving unit provided near the second surface located adjacent to the first surface. The adjustment button 9 and the like are an example of a receiving unit provided on the first surface or the display unit and configured to receive user operation. The controller 6 is an example of a display control unit configured to cause the display unit to display a threshold adjusted through the receiving unit and a signal value indicating an amount of light received by the light receiving unit. The control board 30 is an example of a control board (a first substrate) housed on the inside of the housing, the display control unit being mounted on or connected to the control board. The signal cable 51 is an example of a signal cable for connecting the control board 30 and the display 5. As shown in FIGS. 6A to 6C, the display 5 includes a connecting section connected to the signal cable 51. The connecting section of the display 5 is disposed between the display region and the signal cable 51 in the longitudinal direction of the housing. Note that, as shown in FIGS. 7A to 7C and FIG. 10, the display 5 has two short sides and two long side. The signal cable 51 may be connected to the side of one short side of the two short side. Consequently, a connection structure of the signal cable 51 capable of securing a sufficient display area concerning the display 5 in the photoelectric switch 1 is provided.

The display unit may include a dot matrix display and a driving circuit configured to drive the dot matrix display. The display 5 is an example of the dot matrix display. The driving IC 54 is an example of a driving circuit. As shown in FIG. 7A and the like, the driving IC 54 is provided at the end portion in the longitudinal direction of the display 5. The signal cable 51 is connected to the driving IC 54. That is, the driving IC 54 may be provided between the display 5 and the connecting section in the longitudinal direction of the housing. Note that the display 5 and the driving IC 54 may be disposed on the same member. According to FIG. 7A, the OLED layer 71 of the display 5 and the driving IC 54 are disposed on the transparent member 70.

As shown in FIGS. 11B and 11C, the signal cable 51 may include a first portion for connecting the display 5 and the driving IC 54 and a second portion for connecting the driving IC 54 and the control board 30. As shown in FIG. 10, the signal cable 51 may be an FPC cable. Consequently, it is easy to connect the display 5 disposed on the outside of the housing and the control board 30 disposed on the inside of the housing.

The housing may include the upper case 3 and the lower case 2. In this case, the first surface is the upper surface of the upper case 3.

According to the present invention, the opening section 25 is provided on the outer surface, in particular, the upper surface of the housing. The opening section 25 makes it possible to dispose the signal cable 51 from the inside to the outside of the housing and makes it possible to attach the display 5 to the outer surface of the housing. That is, the signal cable 51 is connected to the control board 30 via the opening section 25. Because the display 5 is provided on the outer surface of the housing, an impression that the display 5 is disposed in the depth is less easily given to the user. Therefore, the display 5 is easily seen for the user. The side of the short side of the display 5 to which the signal cable 51 is connected may be the side of the short side farther from the second surface (the front surface of the display 5) of the two short sides of the display 5. In this case, the opening section 25 may be provided, for example, on the rear end side of the backbone member 36. The side of the short side of the display 5 to which the signal cable 51 is connected may be the side of the short side closer from the second surface (the front surface) of the two short sides of the display 5. In this case, the opening section 25 may be provided, for example, on the front end side of the backbone member 36. Note that the backbone member 36 of the upper case 3 is supported by the control board 30. This is useful for improvement of the rigidity of the housing. Further, the thickness of the backbone member 36 set larger than the thickness of the other portions of the upper case 3 improves the configuration of the upper case 3 itself. In particular, the increase in the rigidity of the backbone member 36 makes it easy to protect the display 5.

As explained with reference to FIGS. 8A to 8E and the like, the first surface (the upper surface) of the upper case 3 includes the opening section 25. The opening section 25 functions as a hole-like or cutout-like passing section for allowing the signal cable 51 to pass from the outside to the inside of the housing. As shown in FIG. 8B and the like, the opening section 25 may be a slit provided along the latitudinal direction (the x-axis direction) of the first surface. As shown in FIG. 8E and the like, the opening section 25 may be a slit provided along the longitudinal direction (the z-axis direction) of the first surface. As shown in FIG. 7C, the driving IC 54 may be housed on the inside of the housing. This reduces the dimension of the mounting section of the display 5. As shown in FIG. 1 and the like, the longitudinal direction of the display 5 and the longitudinal direction of the first surface are parallel.

As shown in FIG. 5 and the like, the cover member 4 is adopted as a holding member configured to hold the display 5 provided on the outer surface of the housing. Consequently, it is possible to dispose the display 5 on the outer surface of the housing. Information displayed on the display 5 is easily seen for the user. By disposing the cover member 4 on the outer side of the housing in this way, it is possible to increase the display region of the display 5. However, when the display 5 is provided on the outer surface of the housing, the display 5 easily receives a shock from the outside. Therefore, the cover member 4 plays a role for protecting the display 5. Further, as shown in FIGS. 5 and 10 and the like, the shield member 50 is an example of a shield member provided in at least a part of the side surface of the display 5. As shown in FIG. 13 and the like, the cover member 4 is an example of a cover member configured to sandwich the shield member 50 between the side surface of the display 5 and the cover member 4 and cover at least a part of the side surface of the display 5. In this way, the shield member 50 also plays a role for protecting the display 5 from a shock.

As shown in FIG. 5, the cover member 4 may include a window section 40 configured to expose the display region of the display 5. The cover member 4 may be configured to cover a non-display region of the display 5. The non-display region is a portion on which information is not displayed in the upper surface of the display 5.

The thickness of one frame (e.g., the right frame 41b or the left frame 41a) located at the end portion in the longitudinal direction of the window section 40 among the four frames located around the window section 40 in the cover member 4 is larger than the thickness of two frames (e.g., the front frame 41d and the rear frame 41c) located at both ends in the latitudinal direction of the window section 40. This makes it easy to secure a display area in the latitudinal direction of the display 5. The cover member 4 may be configured to engage with projecting sections projecting from the first surface. For example, the projecting sections (the fringes 47) projecting from the upper surface of the upper case 3 may engage with the cutouts 46 of the cover member 4.

The shield member 50 may be electrically connected to the ground line of the signal cable 51. Consequently, the shield member 50 reduces the influence of electric noise on the display 5.

As shown in FIG. 13, the length of the short side of the first surface of the upper case 3 is substantially equal to a sum of the length of the short side of the display 5, the thickness of the side surfaces (the center legs 43) located at both the ends in the latitudinal direction of the cover member 4, and the thickness of the shield member 50 (the right wall 50b and the left wall 50c). Consequently, it is possible to bring the length in the latitudinal direction of the display 5 close to the length in the latitudinal direction of the upper surface of the photoelectric switch 1 while protecting the display 5 with the shield member 50. That is, it is easy to increase the size of characters displayable on the display 5.

As shown in FIG. 10, the signal cable 51 and the shield member 50 may be an integrated FPC cable. Consequently, it is possible to reduce the number of components. It is easy to integrate the ground line to the shield member 50 with the signal cable 51.

As shown in FIGS. 10 and 11B, the FPC cable may be bent at least in one part. Further, a part of the shield member 50 and a part of the signal cable 51 may overlap.

The shield member 50 may include a first region (the bottom section 50a) configured to cover the bottom surface of the display 5, a second region (the right wall 50b) configured to protect a first side surface of the display 5, a third region (the left wall 50c) configured to protect a second side surface of the display 5, and a fourth region (the front wall 50d) configured to protect a third side surface of the display 5. As shown in FIG. 10, the second region, the third region, and the fourth region may be connected to the first region.

The upper cover 19 is an example of an openable lid configured to cover the receiving unit and the display 5 covered by the cover member 4. Consequently, oil droplets and the like generated in the factory less easily adhere to the adjustment button 9 and the display 5. Breakage of the adjustment button 9 and the display 5 would less easily occur. The cover member 4 is a cover configured to cover a part of the display 5 and provided on the outer side of the first surface of the housing. As shown in FIGS. 6B and 9B, the height of the upper surface of the cover member 4 and the height of a surface on which the receiving unit is provided of the first surface may be substantially the same in the height direction of the housing.

As shown in FIG. 1 and the like, the opening section 25 may be covered by the cover member 4 or the display 5. Consequently, foreign matters less easily intrude into the inside of the housing through the opening section 25.

Characters may be written on the surface of one frame (e.g., the rear frame 41c) located at the end portion in the longitudinal direction of the window section 40. For example, when a transmissive fiber is used, there are operation modes such as D-ON (dark on) for lighting the display lamp 24 when work is detected and L-ON (light on) for extinguishing the display lamp 24 when work is detected. In this case, the display 5 may display a mark (e.g., an arrow mark) indicating one of "L-ON" and "D-ON" printed on the rear frame 41c. The rear end of the display 5 and the rear frame 41c are adjacent. Therefore, the display 5 may display information associated with information displayed on the rear frame 41c.

As shown in FIG. 7A, the display 5 may include a transparent member (the transparent member 70), an OLED (the OLED layer 71) provided on the lower surface side of the transparent member, and a base material (the transparent base material 72 and the backbone member 36) provided on the lower surface side of the OLED. The cover member 4 is provided to protect at least the OLED layer 71. Consequently, breakage of the OLED layer 71 and the influence of electric noise are reduced.

As shown in FIG. 13, the thickness of the cover member 4 is smaller than the thickness of the housing (the upper case 3 and the lower case 2). Consequently, it is possible to increase the length in the latitudinal direction of the display 5 as much as possible. It is possible to increase the surface area of the display 5. It is possible to increase the size of characters displayed on the display 5.

In the embodiment explained above, the photoelectric switch 1 is adopted as an example of the sensor unit. However, the sensor unit may be a sensor unit configured to detect other physical quantities such as a pressure sensor. The light receiving element 33 is an example of a detecting unit. However, the light receiving element 33 may be a detection element configured to detect a physical quantity (e.g., a light receiving amount or pressure) detected from a detection target and output a detection signal according to the physical quantity. The display 5 is an example of a display unit configured to display the physical quantity detected by the detecting unit. The display lamp 24 and the output cable to the outside are an example of an output unit configured to output a comparison result of the physical quantity detected by the detecting unit and a threshold. The adjustment button 9 is an example of a receiving unit and an operation unit configured to receive adjustment operation for the threshold. The adjustment button 9 is an example of a threshold adjusting unit configured to adjust a threshold. The controller 6 is an example of a display control unit configured to cause the display unit to display, in a display region of the display unit, the threshold adjusted through the receiving unit and a signal value indicating the physical quantity detected by the detecting unit. The connecting section of the display 5 is disposed between the adjustment button 9 and the display region (the OLED layer) of the display 5.

As shown in FIG. 3, the lower case 2 is a lower case having a concave shape in section opened in an upper surface. The upper case 3 is an upper case configured to put a lid on the upper surface of the lower case 2. The housing of the photoelectric switch 1 is formed by the upper case 3 and the lower case 2. The control board 30 is an example of a first substrate. The control board 30 is housed in the lower case 2 to face a third surface located adjacent to the first surface and the second surface. The first surface is the upper surface of the upper case 3. The third surface is, for example, the coupling sections 17a and 17b. More strictly, the third surface is one of inner surfaces forming the lower case 2.

What is claimed is:

1. A photoelectric switch comprising:
   a housing having a substantially rectangular parallelepiped shape;
   a display unit provided on a first surface of the housing and including a display region;
   a light projecting unit and a light receiving unit provided on a second surface located adjacent to the first surface;
   a receiving unit provided on the first surface and configured to receive operation;
   a display control unit configured to cause the display unit to display, in the display region of the display unit, a threshold adjusted through the receiving unit and a signal value indicating an amount of light received by the light receiving unit;
   a first substrate housed on an inside of the housing, the display control unit being connected to the first substrate; and
   a signal cable for connecting the first substrate and the display unit, wherein
   the display unit includes a connecting section connected to the signal cable, and
   the connecting section of the display unit is disposed between the display region and the signal cable in a longitudinal direction of the housing.

2. The photoelectric switch according to claim 1, wherein the display unit includes a dot matrix display and a driving circuit configured to drive the dot matrix display, and the signal cable is connected to the connecting section.

3. The photoelectric switch according to claim 2, wherein the dot matrix display and the driving circuit are disposed on a same member.

4. The photoelectric switch according to claim 1, wherein the display unit includes a dot matrix display, and the signal cable includes a first portion for connecting the dot matrix display and a driving circuit configured to drive the dot matrix display and a second portion for connecting the driving circuit and the first substrate.

5. The photoelectric switch according to claim 1, wherein the signal cable is an FPC cable.

6. The photoelectric switch according to claim 1, wherein the housing includes a lower case having a concave shape in section opened in an upper surface and an upper case configured to put a lid on the upper surface of the lower case, the first substrate is housed in the lower case to face a third surface located adjacent to the first surface and the second surface, and the first surface is an upper surface of the upper case.

7. The photoelectric switch according to claim 1, wherein a second substrate, which is a transparent substrate, of the display unit has two short sides and two long sides, the signal cable is connected to the connecting section present on a side of one short side of the two short sides, and the side of the short side to which the signal cable is connected is a side of a short side farther from the second surface of the two short sides.

8. The photoelectric switch according to claim 1, wherein a second substrate, which is a transparent substrate, of the display unit has two short sides and two long sides, the signal cable is connected to the connecting section present on a side of one short side of the two short sides, and the side of the short side to which the signal cable is connected is a side of a short side closer from the second surface of the two short sides.

9. The photoelectric switch according to claim 1, wherein the receiving unit includes a threshold adjusting unit configured to adjust the threshold, and the connecting section of the display unit is disposed between the threshold adjusting unit and the display region.

10. A sensor unit comprising:
a housing having a substantially rectangular parallelepiped shape;
a display unit provided on a first surface of the housing and including a display region;
a detecting unit provided on a second surface located adjacent to the first surface and configured to output a detection signal according to a physical quantity detected from a detection target;
a receiving unit provided on the first surface and configured to receive operation;
a display control unit configured to cause the display unit to display, in the display region of the display unit, a threshold adjusted through the receiving unit and a signal value indicating the physical quantity detected by the detecting unit;
a substrate housed on an inside of the housing, the display control unit being connected to the substrate; and
a signal cable for connecting the substrate and the display unit, wherein
the display unit includes a connecting section connected to the signal cable, and
the connecting section of the display unit is disposed between the display region and the signal cable in a longitudinal direction of the housing.

11. A photoelectric switch comprising:
a housing having a substantially rectangular parallelepiped shape;
a display unit provided on a first surface of the housing and including a display region;
a light projecting unit and a light receiving unit provided on a second surface located adjacent to the first surface;
a receiving unit provided on the first surface and configured to receive operation;
a display control unit configured to cause the display unit to display, in the display region of the display unit, a threshold adjusted through the receiving unit and a signal value indicating an amount of light received by the light receiving unit;
a first substrate housed on an inside of the housing, the display control unit being connected to the first substrate; and
a signal cable for connecting the first substrate and the display unit, wherein
a second substrate, which is a transparent substrate, of the display unit has two short sides and two long sides, and
the signal cable is connected to a side of one short side of the two short sides.

12. The photoelectric switch according to claim 1, wherein the signal cable is connected between the first substrate and the display unit through an opening provided on the first surface of the housing.

13. The sensor unit according to claim 10, wherein the signal cable is connected between the substrate and the display unit through an opening provided on the first surface of the housing.

14. The photoelectric switch according to claim 1, wherein the signal cable is connected between the first substrate and the display unit through an opening provided on the first surface of the housing.

15. The sensor unit according to claim 10, wherein
the receiving unit includes a threshold adjusting unit configured to adjust the threshold, and
the connecting section of the display unit is disposed between the threshold adjusting unit and the display region.

16. The photoelectric switch according to claim 11, wherein
the receiving unit includes a threshold adjusting unit configured to adjust the threshold, and
the connecting section of the display unit is disposed between the threshold adjusting unit and the display region.

17. The photoelectric switch according to claim 2, wherein the signal cable is an FPC cable.

* * * * *